United States Patent [19]
Lund et al.

[11] 4,128,898
[45] Dec. 5, 1978

[54] STRUCTURING OF BUBBLE DOMAINS IN A BUBBLE DOMAIN MEMORY PLANE

[75] Inventors: Roger E. Lund, Woodbury; Marlin M. Hanson, Cologne, both of Minn.

[73] Assignee: Sperry Rand Corporation, New York, N.Y.

[21] Appl. No.: 786,318

[22] Filed: Apr. 11, 1977

[51] Int. Cl.$^2$ ............................................. G11C 11/14
[52] U.S. Cl. ........................................ 365/2; 365/19; 365/37
[58] Field of Search ............................. 365/2, 19, 37

[56] References Cited
U.S. PATENT DOCUMENTS
4,012,724   3/1977   Hanson et al. .......................... 365/2

OTHER PUBLICATIONS
IBM Journal of Research & Development – vol. 20, No. 2 Mar. 1976, pp. 132-137.

Primary Examiner—James W. Moffitt
Attorney, Agent, or Firm—Kenneth T. Grace; William E. Cleaver; Marshall M. Truex

[57] ABSTRACT

Defining the structuring of bubble domains in the magnetizable layer of a bubble domain memory plane is determined by modification of the magnetic characteristics of the magnetizable layer in the confinement area. The memory plane is comprised of a non-magnetic Gadolinium Gallium Garnet (GGG) layer which is a supporting substrate upon which is formed by the liquid phase epitaxy (LPE) method a magnetizable layer in which bubble domains are capable of being generated, sustained and moved about. Formed upon the bubble domain supporting magnetizable layer is a matrix array of conductive drive lines, the intersections of which define respective memory areas. In each memory area the position of the bubble domain in the magnetizable layer is determined by modifying the magnetic characteristics of the magnetizable layer in a confinement area as by an ion milling process. The ion milled confinement area along the line of the thickness gradient generates a perpendicular field $H_P$ that tends to prevent the bubble domain from escaping from the so-defined confinement area. The perpendicular field $H_P$ component that is generated by the thickness gradient produces a sharp potential minimum at the edge of the ion milled region. This potential minimum draws the bubble domain toward the edge of the thickness gradient whereby the bubble domain size may be expanded to fill the confinement area. Additionally, the confinement area may consist of a plurality of interconnected lobes each of which defines a given bubble position, each of which bubble positions may be utilized to define a memory position that may be utilized in an optical page composer of an optical data processing system.

10 Claims, 6 Drawing Figures

STRUCTURING OF BUBBLE DOMAINS IN A BUBBLE DOMAIN MEMORY PLANE

BACKGROUND OF THE INVENTION

In the A. H. Bobeck, et al, U.S. Pat. No. 3,513,452, there is disclosed an apparatus for structuring the positioning of bubble domains in a memory plane in a figure-8 confinement area. The confinement area is defined by the positions of apertures in a glass substrate, which apertures are filled with a ferric oxide. The matrix array of X and Y drive lines form intersections at the center of the confinement area whereby half-select currents position the confined bubble domains in one of two drive line defining quadrants. Additionally, in the F. A. DeJonge, U.S. Pat. No. 3,787,825, there is disclosed an apparatus for structuring the positioning of bubble domains in a memory plane at one of two bit positions defined by two Permalloy dots. An energized driveline positions the bubble domains in the selected one bit position. Further, in the publication "Bubbles As Latrix Elements", M. M. Hanson, et al, AIP Conference Proceedings, No. 29, 3M - 1975, 21st Annual Conference, pp. 626–628, there is disclosed a page composer for an optical data processing system in which a bubble domain is positioned in one of four quadrants defined by two orthogonally intersecting slotted strip lines. By applying the proper current amplitudes and polarities to the two intersecting strip lines, the so-confined bubble domains may be moved between any two of the four quadrants. Lastly, in the publication "Effects Of Abrupt Changes In Film Thickness On Magnetic Bubble Forces", T. W. Collins, et al, IBM J. Res. Develop., Volume 20, No. 2, March 1976, pp. 132-137, there is disclosed the concept that in a magnetizable layer in which there are generated areas of differing thicknesses, the area of the thickness gradient generates a perpendicular field $H_P$ that tends to attract bubble domains to the gradient edge and also to prevent their movement across the thickness gradient.

SUMMARY OF THE INVENTION

The present invention is directed toward an apparatus for and a method of improving the operation of a bubble domain memory plane and it is particularly directed toward the use thereof in an optical data processing system. The method involves, e.g., the ion milling of closed confinement areas of predetermined planar contours which confinement areas define the static position of bubble domains and their interconnecting paths therebetween when subjected to appropriate drive fields. The thickness gradient at the edge of the confinement area generates a perpendicular field $H_P$ which during the static condition tends to expand the bubble domain diameter, as compared to the bubble domain diameter in the absence of the thickness gradient. This static condition expanded bubble domain diameter provides an increased light transmission for improved optical processing capabilities of the hereinabove referenced M. M. Hanson, et al., publication. Additionally, the drive field requirements for the transfer of the bubble domains between static condition positions during the dynamic condition are substantially reduced in amplitude because lower $H_C$ materials can be used, thereby providing an overall improved method of operation with the concomitant easing of restraints upon the associated apparatus.

DESCRIPTION OF THE PREFERRED EMBODIMENTS

Figure 1:
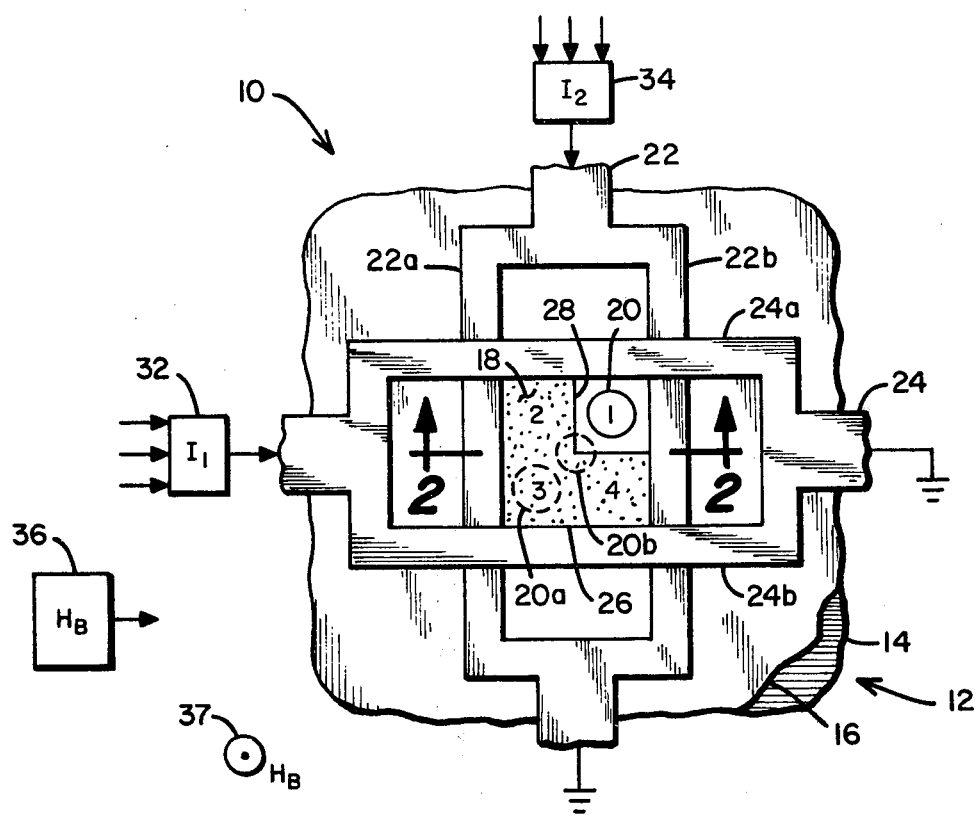
FIG. 1 is a block diagram of a system bubble domain memory incorporating a first embodiment of the present invention.
Figure 2:
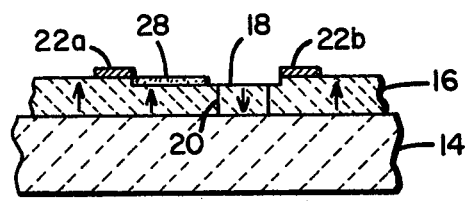
FIG. 2 is an illustration of a cross section of the memory plane of FIG. 1 taken along line 2—2 thereof.

With particular reference to FIG. 1 there is presented a block diagram of system 10 incorporating the first embodiment of the present invention. System 10 includes a memory plane 12 which is a laminated, integral structure the layers of which are preferably formed by the liquid phase epitaxy (LPE) method. With particular reference to FIG. 2 there is presented an illustration of a cross section of the memory plane 12 of FIG. 1 taken along line 2—2 thereof. FIG. 2 illustrates that memory plane 12 is comprised of a plurality of stacked, superposed layers preferably integrally formed by the liquid phase epitaxial method and is comprised of a non-magnetic garnet support layer 14 of Gadolinium Gallium Garnet (GGG) of approximately 80 microns ($\mu$m) in thickness upon which are formed the following successive layers. Upon support layer 14 there is generated a bubble domain layer 16 of a magnetizable material of 5–10 $\mu$m in thickness in which a plurality of bubble domains 20 may be generated, sustained and moved about. Upon bubble domain layer 16, as by many well-known vapor deposition techniques, there are formed the orthogonally arranged copper drive lines 22 and 24 having the split strip line portions 22a, 22b and 24a, 24b, respectively, for forming a memory area 26 that is defined by the opposing inside edges of the respective split strip line portions of drive lines 22 and 24. Oriented within the memory area 26 is an opaque shield 28 that is oriented in the second, third and fourth quadrants, but not in the first quadrant, of memory area 26, all as more fully discussed in the M. M. Hanson, et al, Pat. No. 4,012,724. Also illustrated and $I_1$ drive field source 32 and $I_2$ drive field source 34, which couple the appropriate drive fields to drive lines 24 and 22 for moving the bubble domain 20 between the four quadrants of the memory area defined by the split drive lines 24 and 22, all as described in more detail in the M. M. Hanson, et al, U.S. Pat. No. 4,012,724. Also provided is the bias field $H_B$ source 36 for coupling, normal to the plane of memory plane 12, the constant amplitude bias field $H_B$ denoted by the dot and concentric circle 37.

FIG. 2 illustrates that the ion milled closed confinement area 18 is coterminal with and that the coplanar contour thereof is defined by the opposing inside edges of the split strip lines 22a, 22b and 24a, 24b. Also illustrated is that bubble domain 20 is attracted by the thickness gradient of confinement area 18 to be positioned in its static quadrant 1 position adjacent the edges of confinement area 18. FIG. 1 illustrates that bubble domain 20, in its static quadrant 1 position and bubble domain 20a in its static quadrant 3, position have an expanded diameter as compared to the contracted diameter of that of bubble domain 20b during the dynamic position when subjected to drive fields and is being moved between its static positions in quadrants 1 and 3.

Confinement area 18 is preferably formed by the removal of a portion of the top surface of bubble domain layer 16 as by an ion milling process; however, other techniques may be utilized such as a chemical subtractive process utilizing photo—or electron—resist layers that will provide a confinement area of a reduced thickness as compared to the thickness of that of the remaining or inactive portion of the magnetizable layer 16.

Figure 3:
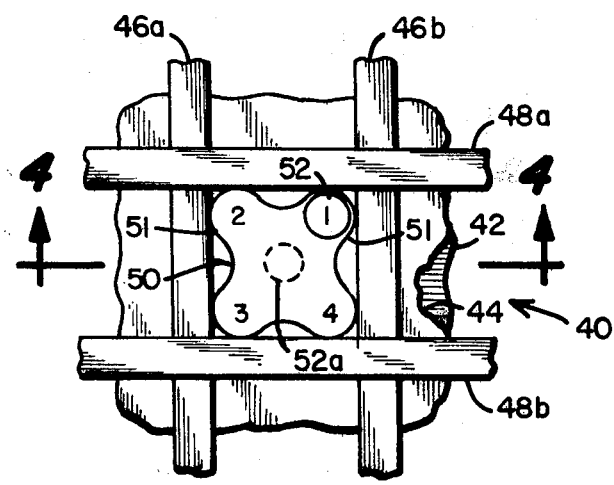
FIG. 3 is an illustration of a portion of a memory plane incorporating a second embodiment of the present invention.
Figure 4:
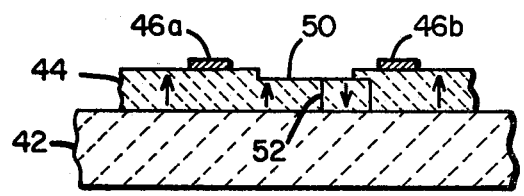
FIG. 4 is an illustration of a cross section of the memory plane of FIG. 3 taken along line 4—4 thereof.

With particular reference to FIG. 3 there is presented an illustration of a portion of a second embodiment of the present invention in which a memory plane 40 is comprised of the superposed support layer 42 and magnetizable layer 44 upon which are formed the split strip line conductors 46a, 46b and 48a, 48b for forming a memory area at the intersection thereof. Within the memory area defined by the intersecting split strip lines there is illustrated a confinement area 50 which is, e.g., ion milled out of the top surface of magnetizable layer 44 such as in the confinement area 18 of FIG. 1; however, here the planar contour of confinement area 50 is specifically designed to have four lobes 51, the centers of which are located at the respective quadrants 1, 2, 3, 4 of the memory area. The four lobes 51 are each of a radius that is substantially larger, i.e., up to a 50% larger diameter than that of a bubble domain that would otherwise be sustained by layer 44, whereby the static positioned bubble domain 52, as in quadrant 1, is expanded because of the thickness gradient of the containment area 50 sidewalls so as to substantially fill the associated lobe. With particular reference to FIG. 4, which is a cross-sectional view of memory plane 40 of FIG. 3 taken along line 4—4 thereof, there is illustrated the restricted width of the confinement area 50 between lobes 51. The perpendicular, i.e., normal to the plane of layer 44 field $H_P$ that is generated by the thickness gradient of the sidewall of confinement area 50 tends to move the bubble domain 52 into its static position potential well within the lobe 51 at quadrant 1 and thence to be expanded in its diameter by the sidewall generated perpendicular field $H_P$.

Figure 5:
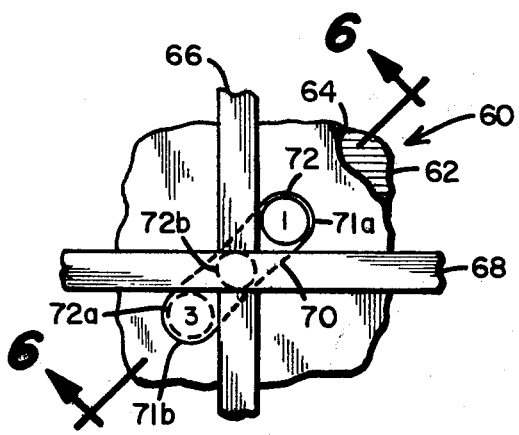
FIG. 5 is an illustration of a portion of a memory plane illustrating a third embodiment of the present invention.
Figure 6:
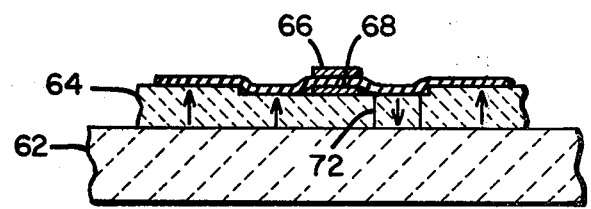
FIG. 6 is an illustration of a cross section of the memory plane of FIG. 5 taken along line 6—6 thereof.

With particular reference to FIG. 5 there is presented an illustration of a memory plane incorporating a third embodiment of the present invention. In this embodiment, as illustrated in FIG. 6, taken along line 6—6 of FIG. 5—there are illustrated the stacked, superposed relationships of the support layer 62 and the magnetizable layer 64 upon which are formed, as by many well-known techniques, the othogonally oriented drive lines 66, 68 the intersection of which defines a memory area and in particular the diagonally oriented quadrants 1 and 3. In this configuration of FIG. 5 and FIG. 6 there is illustrated a closed confinement area 70 having the two opposed lobes 71a, 71b intercoupled by a connecting area having a restricted width that is substantially narrower than the diameter of the lobes 71a, 71b. This restricted width accommodates the bubble domain 72, in its smaller diameter configuration of 72b when subjected to the appropriate drive fields, to transfer from quadrant 1 to quadrant 3. Lobes 71a, 71b of confinement area 70 are, as before, of a substantially larger diameter than that of the dynamically effected bubble domain 72b whereby the static bubble domains 72, 72a are attracted by the sidewall thickness gradient generated perpendicular field $H_P$ thereof to be expanded to have a substantially larger diameter in their static positions of quadrants 1 and 3.

Accordingly, it can be seen that the present invention provides a novel means of structuring the positions of bubble domains within a memory plane while concurrently propagating such bubble domains in the memory plane within a confinement area. The confinement area is defined as an area of reduced thickness in a bubble domain supporting magnetizable layer which confinement area has a sidewall that establishes a thickness gradient which, in turn, establishes a perpendicular field $H_P$. This so-generated perpendicular drive field $H_P$ not only, under the influence of normal operating drive fields, limits the movement of the bubble domains within the confinement area, but also when the bubble domain is in a static position, without any drive fields coupled thereto, tends to expand the diameter of the bubble domain into a domain of substantially larger cross section. This expanded bubble domain, in turn, permits the easing of manufacturing limitations upon the bubble domain memory plane while providing the necessary bubble domain characteristics for the logical manipulation thereof and the use as light valves in a page composer in an optical data processing system.

What is claimed is:

1. In a bubble domain memory system including a planar layer of a magnetizable material in which bubble domains may be generated, sustained and moved between first, second, third and fourth stable positions in a memory area in said layer, which stable positions are within a memory area that is defined by the inside opposing edges of intersecting first and second inductively coupled slotted strip lines, by drive current signals that are coupled to said layer by said slotted strip lines, in the method of preventing said bubble domains from escaping from the magnetomotive effect of said drive current signals to transfer said bubble domains between said first, second, third and fourth stable positions, the improvement comprising:

removing a portion of the surface of said layer within said memory area to form a confinement area having a thickness gradient along the periphery thereof, said thickness gradient generating a field $H_P$ that is oriented normal to the plane of said layer for preventing bubble domains from escaping from said confinement area.

2. The method of claim 1 further including:
forming said removed portion of four lobes that are oriented in each of the four quadrants of said memory area, each of said four lobes defining an associated one of said stable positions.

3. The method of claim 2 further including:
forming each of said four lobes of a diameter that is up to 50% larger than the diameter of a bubble domain that would otherwise be sustained by said layer.

4. The method of claim 3 further including:
forming the portion of said removed portion that connects said four lobes of a width that is substantially narrower than the distance across two adjacent lobes.

5. A bubble domain memory plane, comprising:
a non-magnetizable substrate;

a bubble domain layer in which a bubble domain may be generated, sustained and moved about by appropriate drive fields;

a split X drive line;

a split Y drive line insulatively superposed said split X drive line and orthogonally oriented with respect thereto for forming a memory area defined by the inside edges of said split drive lines; and, a confinement area within said memory area defined by a removed portion of said layer, the edges of said removed portion forming a thickness gradient in said layer that generates a field $H_p$ that is oriented normal to the plane of said layer for attracting a bubble domain, but preventing bubble domain escape from said confinement area.

6. The bubble domain memory plane of claim 5 in which said confinement area has four lobes oriented in each of the four quadrants of said memory area.

7. The bubble domain memory plane of claim 6 in which the diameters of each of said four lobes are up to 50% larger than the diameter of a bubble domain that would otherwise be sustained by said layer.

8. In a bubble domain memory system including a planar layer of a magnetizable material in which bubble domains may be generated, sustained and moved between first and second stable positions in a memory area in said layer, which two stable positions are associated with two diagonally opposing quadrants formed by intersecting first and second inductively coupled strip lines, by drive current signals that are coupled to said layer by said strip lines, in the method of preventing said bubble domains from escaping from the magnetomotive effect of said drive current signals to transfer said bubble domains between said first and second stable positions, the improvement comprising:

removing a portion of the surface of said layer at and between said two stable positions to form a closed confinement area within said memory area that has a closed thickness gradient along the closed periphery thereof, said thickness gradient generating a field $H_p$ that is oriented normal to the plane of said layer for preventing bubble domains from escaping from said confinement area.

9. The method of claim 8 further including:

forming said removed portion of two lobes that are oriented in each of said two diagonally opposing quadrants that are formed by said two intersecting strip lines, said two lobes having diameters that are up to 50% larger than the diameter of a bubble domain that would otherwise be sustained by said layer.

10. The method of claim 9 further including:

forming the portion of said removed portion that connects said two lobes of a width that is substantially narrower than the diameters of said lobes.

* * * * *